(12) United States Patent
Yang et al.

(10) Patent No.: US 10,312,246 B2
(45) Date of Patent: Jun. 4, 2019

(54) SPLIT-GATE FLASH MEMORY CELL WITH IMPROVED SCALING USING ENHANCED LATERAL CONTROL GATE TO FLOATING GATE COUPLING

(71) Applicant: Silicon Storage Technology, Inc., San Jose, CA (US)

(72) Inventors: Jeng-Wei Yang, Zhubei (TW); Man-Tang Wu, Hsinchu County (TW); Chun-Ming Chen, New Taipei (TW); Chien-Sheng Su, Saratoga, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 129 days.

(21) Appl. No.: 14/790,540

(22) Filed: Jul. 2, 2015

(65) Prior Publication Data
US 2016/0043095 A1 Feb. 11, 2016

Related U.S. Application Data

(60) Provisional application No. 62/035,062, filed on Aug. 8, 2014.

(51) Int. Cl.
*H01L 27/115* (2017.01)
*H01L 27/11521* (2017.01)
(Continued)

(52) U.S. Cl.
CPC ............ *H01L 27/11521* (2013.01); *H01L 21/823425* (2013.01); *H01L 21/823475* (2013.01);
(Continued)

(58) Field of Classification Search
CPC ... H01L 27/11517–27/11521; H01L 27/11524; H01L 27/11529; H01L 29/42328
See application file for complete search history.

(56) References Cited

U.S. PATENT DOCUMENTS 7,927,994 B1 4/2011 Liu et al.
2004/0065917 A1* 4/2004 Fan ................... H01L 27/11521
257/315
(Continued)

FOREIGN PATENT DOCUMENTS

JP H07226448 A 8/1995
JP 2000286348 A * 10/2000
(Continued)

OTHER PUBLICATIONS

Machine traslation of JP2000286348A, translated Sep. 12, 2017.*
PCT Search Report dated Oct. 2, 2015 corresponding to the related U.S. Appl. No. 15/40189.

*Primary Examiner* — Lauren R Bell
(74) *Attorney, Agent, or Firm* — DLA Piper LLP (US)

(57) ABSTRACT

A non-volatile memory cell includes a semiconductor substrate of first conductivity type, first and second spaced-apart regions in the substrate of second conductivity type, with a channel region in the substrate therebetween. A floating gate has a first portion disposed vertically over a first portion of the channel region, and a second portion disposed vertically over the first region. The floating gate includes a sloping upper surface that terminates with one or more sharp edges. An erase gate is disposed vertically over the floating gate with the one or more sharp edges facing the erase gate. A control gate has a first portion disposed laterally adjacent to the floating gate, and vertically over the first region. A select gate has a first portion disposed vertically over a second portion of the channel region, and laterally adjacent to the floating gate.

16 Claims, 15 Drawing Sheets

(51) Int. Cl.
  *H01L 29/66* (2006.01)
  *H01L 29/40* (2006.01)
  *H01L 21/8234* (2006.01)
  *H01L 29/423* (2006.01)
  *H01L 29/788* (2006.01)

(52) U.S. Cl.
  CPC ...... *H01L 29/401* (2013.01); *H01L 29/42328* (2013.01); *H01L 29/66825* (2013.01); *H01L 29/7881* (2013.01)

(56) References Cited

U.S. PATENT DOCUMENTS

| | | |
|---|---|---|
| 2005/0045940 A1 | 3/2005 | Chen et al. |
| 2009/0200595 A1* | 8/2009 | Nagai ............... H01L 21/28273 257/316 |
| 2013/0313626 A1* | 11/2013 | Huang ............... H01L 29/42328 257/321 |
| 2014/0217489 A1 | 8/2014 | Wang et al. |
| 2015/0200292 A1* | 7/2015 | Chang ............... H01L 21/28273 257/316 |

FOREIGN PATENT DOCUMENTS

| | | |
|---|---|---|
| JP | 2001 085543 | 3/2001 |
| JP | 2006 0937707 | 3/2001 |
| TW | 201419552 | 5/2014 |

* cited by examiner

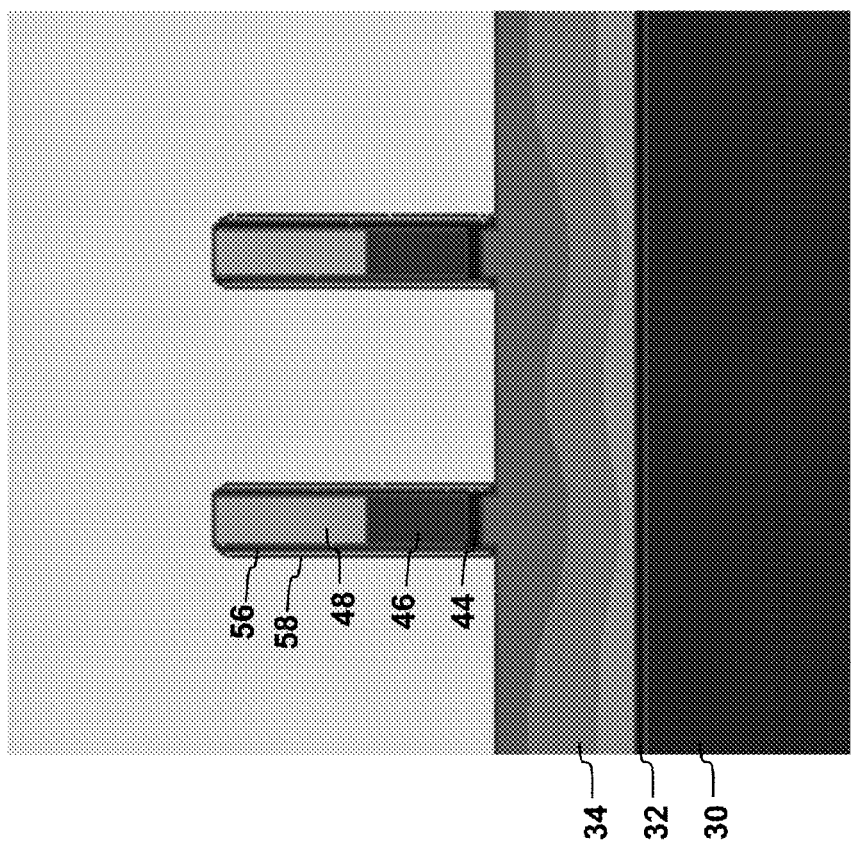

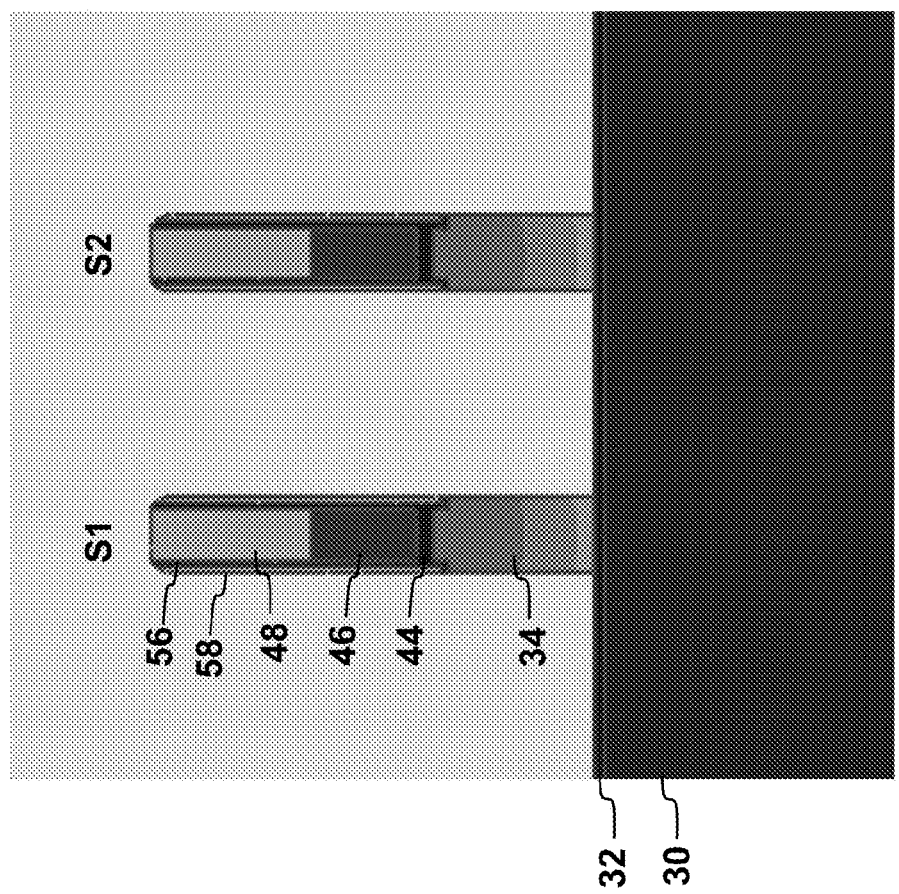

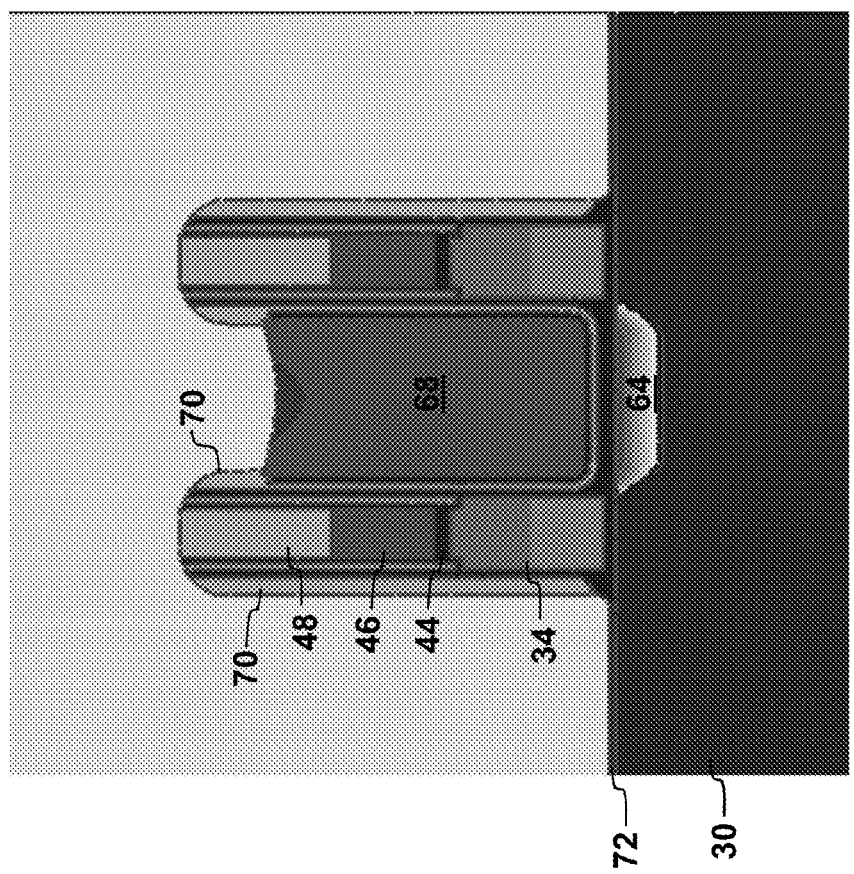

SPLIT-GATE FLASH MEMORY CELL WITH IMPROVED SCALING USING ENHANCED LATERAL CONTROL GATE TO FLOATING GATE COUPLING

RELATED APPLICATIONS

This application claims the benefit of U.S. Provisional Application No. 62/035,062, filed Aug. 8, 2014, and which is incorporated herein by reference.

FIELD OF THE INVENTION

The present invention relates to non-volatile flash memory cells, arrays of such flash memory cells, and methods of manufacturing such memory cells and arrays.

BACKGROUND OF THE INVENTION

Split-Gate flash memory cell arrays are well known in the art. One example of such an array is disclosed in U.S. Pat. No. 7,927,994, which is incorporated herein by reference for all purposes. FIG. 1 illustrates the known memory cell structure. Specifically, the memory cells each have four gates: a floating gate 10 (disposed over and controlling the conductivity of a first portion of a channel region 12 that extends between the source region 14 and the drain region 16), a control gate 18 (disposed over the floating gate 10), an erase gate 20 (disposed over the source region 14, and shared between two adjacent memory cells), and a select gate 22 (also referred to as word line WL, disposed over and controlling the conductivity of a second portion of the channel region 12).

Capacitive coupling between the control gate 18 and the floating gate 10 during operation is achieved by forming the control gate 18 over the floating gate 10 (preferably in a self-aligned manner) with an ONO insulator (oxide/nitride/oxide) or other dielectric(s) between them as an Inter-Poly-Dielectric (IPD). Capacitive coupling is dictated by the thickness of the intermediary dielectric(s), and the relative surface areas of the two gates that are positioned adjacent each other.

With advanced technology nodes whereby the size of the substrate surface allotted to each memory cell is reduced, the critical dimension (in the lateral direction) of the control gate is shrunk, which results in a reduction in the capacitive coupling between the floating gate 10 and control gate 18 (due to the reduced surface area sizes of the two gates adjacent to each other). Additionally, the tunnel oxide between the floating gate 10 and the erase gate 20 (through which electrons tunnel during an erase operation) is exposed to subsequent logic oxide nitridation or HKMG (high-K metal gate) processing. Therefore, the quality of the tunnel oxide is difficult to control. These two issues make it difficult to scale down the sizes of these types of memory cells.

BRIEF SUMMARY OF THE INVENTION

The aforementioned problems and needs are addressed by non-volatile memory cell that includes a substrate of semiconductor material of a first conductivity type, first and second spaced-apart regions in the substrate of a second conductivity type different from the first conductivity type, with a channel region in the substrate therebetween, an electrically conductive floating gate having a first portion disposed vertically over and insulated from a first portion of the channel region, and a second portion disposed vertically over and insulated from the first region, wherein the floating gate includes a sloping upper surface that terminates with one or more sharp edges, an electrically conductive erase gate disposed vertically over and insulated from the floating gate, wherein the one or more sharp edges face and are insulated from the erase gate, an electrically conductive control gate having a first portion disposed laterally adjacent to and insulated from the floating gate, and vertically over and insulated from the first region, and an electrically conductive select gate having a first portion disposed vertically over and insulated from a second portion of the channel region, and laterally adjacent to and insulated from the floating gate.

An array of non-volatile memory cells includes a substrate of semiconductor material of a first conductivity type, spaced apart isolation regions formed on the substrate which are substantially parallel to one another and extend in a first direction, with an active region between each pair of adjacent isolation regions, and pairs of memory cells in each of the active regions. Each of the memory cell pairs includes a first region and a pair of second regions spaced apart in the substrate having a second conductivity type different from the first conductivity type, with channel regions in the substrate between the first region and the second regions, a pair of electrically conductive floating gates each having a first portion disposed vertically over and insulated from a first portion of one of the channel regions, and a second portion disposed vertically over and insulated from the first region, wherein each of the floating gates includes a sloping upper surface that terminates with one or more sharp edges, a pair of electrically conductive erase gates each one disposed vertically over and insulated from one of the floating gates wherein the one or more sharp edges of the one floating gate face the one erase gate, an electrically conductive control gate having a first portion disposed laterally adjacent to and insulated from the floating gates, and vertically over and insulated from the first region, and a pair of electrically conductive select gates each having a first portion disposed vertically over and insulated from a second portion of one of the channel regions, and laterally adjacent to and insulated from one of the floating gates.

A method of forming a non-volatile memory cell includes providing a substrate of semiconductor material of a first conductivity type, forming first and second spaced-apart regions in the substrate of a second conductivity type different from the first conductivity type, with a channel region in the substrate therebetween, forming an electrically conductive floating gate having a first portion disposed vertically over and insulated from a first portion of the channel region, and a second portion disposed vertically over and insulated from the first region, wherein the floating gate includes a sloping upper surface that terminates with one or more sharp edges, forming an electrically conductive erase gate disposed vertically over and insulated from the floating gate, wherein the one or more sharp edges face and are insulated from the erase gate, forming an electrically conductive control gate having a first portion disposed laterally adjacent to and insulated from the floating gate, and vertically over and insulated from the first region, and forming an electrically conductive select gate having a first portion disposed vertically over and insulated from a second portion of the channel region, and laterally adjacent to and insulated from the floating gate.

A method of forming an array of non-volatile memory cells includes providing a substrate of semiconductor material of a first conductivity type, forming spaced apart isolation regions formed on the substrate which are substantially parallel to one another and extend in a first direction, with an active region between each pair of adjacent isolation regions, and forming pairs of memory cells in each of the active regions. Each of the pairs of memory cells is formed by forming a first region and a pair of second regions spaced apart in the substrate having a second conductivity type different from the first conductivity type, with channel regions in the substrate between the first region and the second regions, forming a pair of electrically conductive floating gates each having a first portion disposed vertically over and insulated from a first portion of one of the channel regions, and a second portion disposed vertically over and insulated from the first region, wherein each of the floating gates includes a sloping upper surface that terminates with one or more sharp edges, forming a pair of electrically conductive erase gates each one disposed vertically over and insulated from one of the floating gates wherein the one or more sharp edges of the one floating gate face the one erase gate, forming an electrically conductive control gate having a first portion disposed laterally adjacent to and insulated from the floating gates, and vertically over and insulated from the first region, and forming a pair of electrically conductive select gates each having a first portion disposed vertically over and insulated from a second portion of one of the channel regions, and laterally adjacent to and insulated from one of the floating gates.

Other objects and features of the present invention will become apparent by a review of the specification, claims and appended figures.

BRIEF DESCRIPTION OF THE DRAWINGS

FIGS. 3A-3J are side cross sectional views (in the bit line direction) of the steps in forming the non-volatile memory cells of the present invention.

DETAILED DESCRIPTION OF THE INVENTION

The present invention is a modified memory cell configuration and method of making same, where the erase gate is formed over the floating gate, and the control gate is formed over the source region. Improved capacitive coupling between the control gate and the floating gate is achieved by forming these two gates laterally adjacent each other, and by making the floating gate thicker (taller) in the vertical direction. Here, the floating gate and erase gate are self-aligned, whereby the erase gate (instead of the control gate) is disposed over and insulated from the floating gate. The control gate is disposed over and insulated from the source region, instead of the erase gate. With this configuration, the erase gate critical dimension can be shrunk as the technology advances. The tunnel oxide between the floating gate and the erase gate is protected by the erase gate poly, whereby the tunnel oxide quality and reliability will not be degraded by subsequent LV oxide nitridation or HKMG (high-K metal gate) module processing. The floating gate corner can be made shaper by using an isotropic poly etch, and can run perpendicular to the length of the erase gate poly (which extends over a column of floating gates). Therefore, erase efficiency can be enhanced without the need for an erase gate to floating gate over-hang. Because the source line is protected by the control gate poly, word line VT implant can be done with a less critical MCEL Mask, which opens the entire memory. In contrast, in the prior art, a WLVT Mask is used to open the WL area and to cover the source line area with photo-resist. The WLVT overlay (alignment) to diffusion (active) can be a critical issue for prior art device fabrication.

Figure 1:
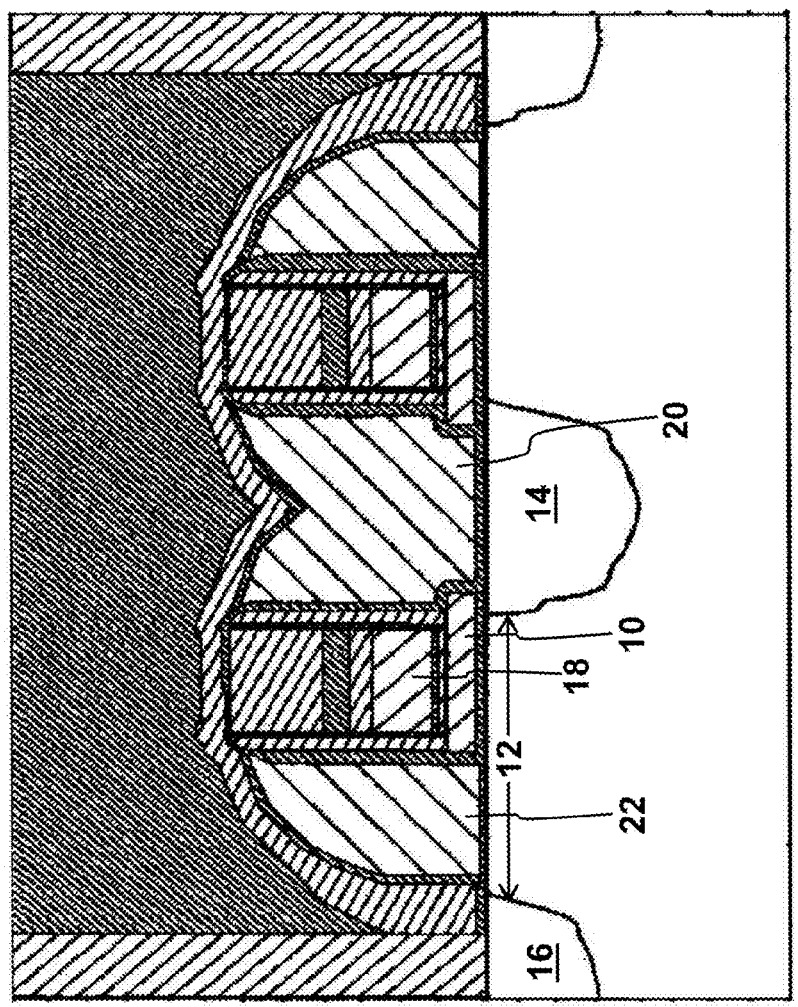
FIG. 1 is a side cross sectional view of conventional non-volatile memory cells.
Figure 2B:
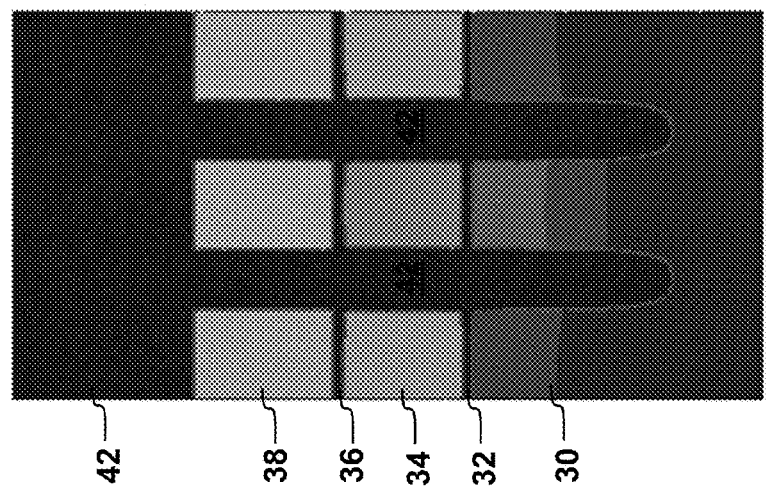
FIGS. 2A-2E are side cross sectional views (in the word line direction) of the steps in forming the non-volatile memory cells of the present invention.
Figure 2A:
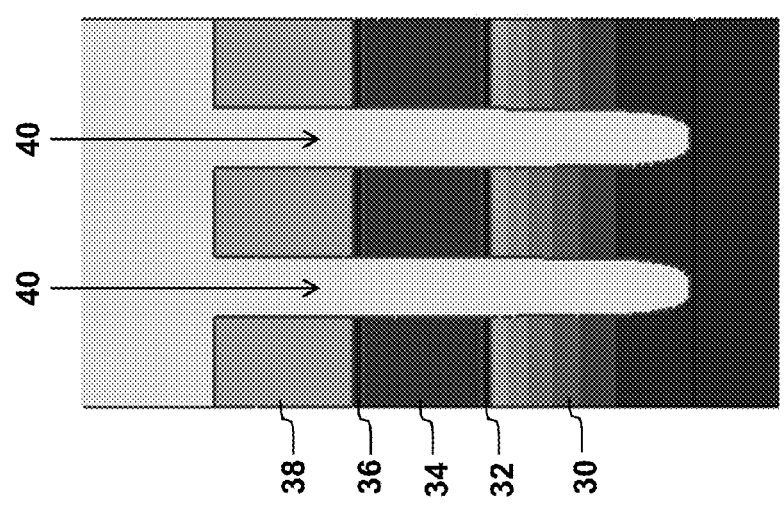

FIGS. 2A-2E are side cross sectional views in the word line direction, and FIGS. 3A-3J are side cross sectional views in the bit line direction, illustrating the steps of forming the memory cells of the present invention. Starting with FIG. 2A, after an MCEL photolithography, cell anti-punch implant, photo resist removal and pad oxide removal, a layer of oxide 32 is grown on the surface of the silicon semiconductor substrate 30 of a first conductivity type. As used herein, substrate can mean a monolithic substrate of single conductivity type, or the well portion of a substrate having a conductivity type different from other portions of the substrate. A layer of polysilicon (poly) 34 is deposited on oxide 32. An oxide layer 36 is deposited on poly layer 34. A nitride layer 38 is deposited on oxide layer 36. A layer of photo resist is coated on nitride layer 38, and portions thereof are selectively removed using a photolithography process, leaving selected portions of the nitride layer 38 exposed. Nitride, oxide, poly, oxide and silicon etches are then performed to form trenches 40 that extend down through nitride 38, oxide 36, poly 34, oxide 32 and into substrate 30. The final structure is shown in FIG. 2A (after the photo resist has been removed).

Figure 2D:
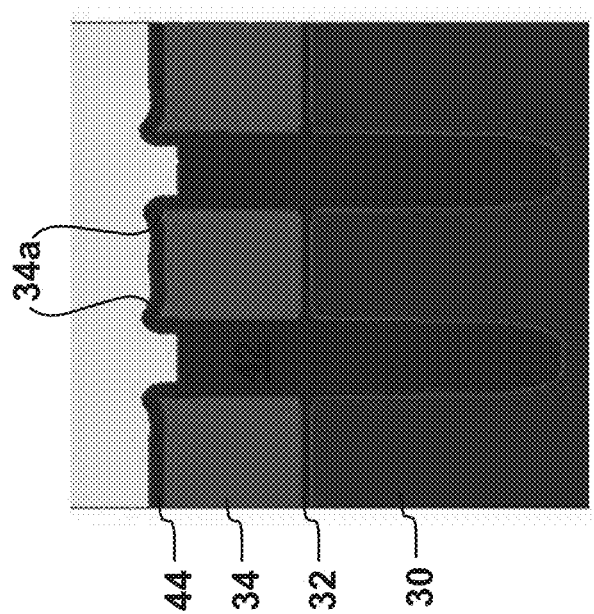
Figure 2C:
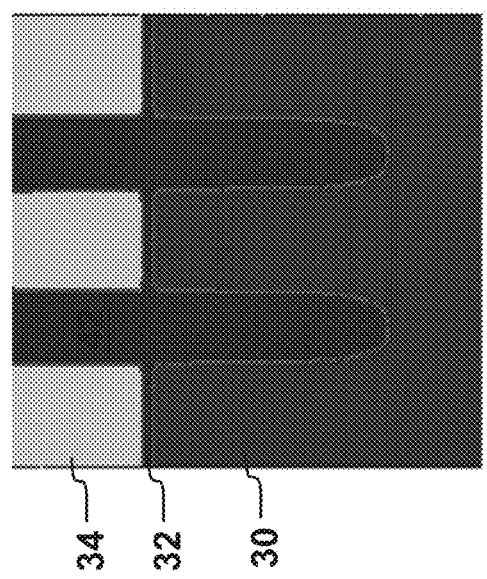

Linear oxidation, and oxide deposition (e.g. HARP, high aspect ratio process), followed by anneal, are performed to form oxide 42 on nitride 38 and in trenches 40, as illustrated in FIG. 2B. An oxide CMP (chemical-mechanical polish) etch is then performed to remove that portion of oxide 42 over nitride 38. A nitride etch is used to remove nitride 38, followed by an oxide etch to remove oxide 36 and any oxide 42 above poly 34, leaving the structure shown in FIG. 2C. A poly etch is performed to create a sloping upper surface for poly 34 that terminates in a pair of sharp upper edges 34a that run along oxide 42 on opposing sides of floating gate 34. An oxide etch is then used to recess the top surface of oxide 42. An implant and anneal are then performed for poly 34. HTO oxide formation is used to form a thin (tunneling) oxide layer 44 over the exposed surfaces of poly 34 (including around sharp upper edges 34a). The resulting structure is shown in FIG. 2D.

Figure 2E:
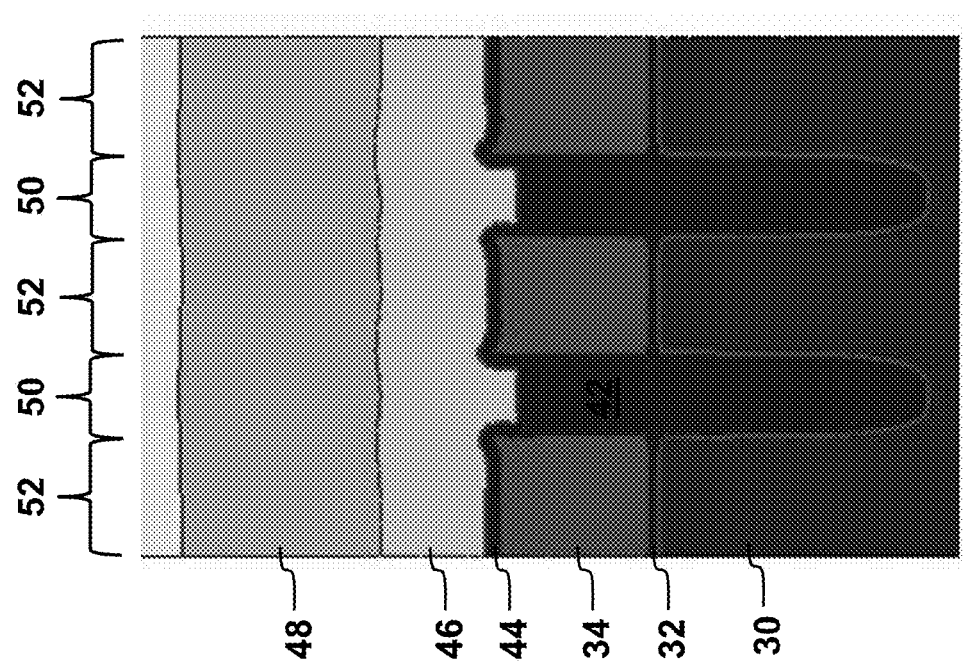
Figure 3A:
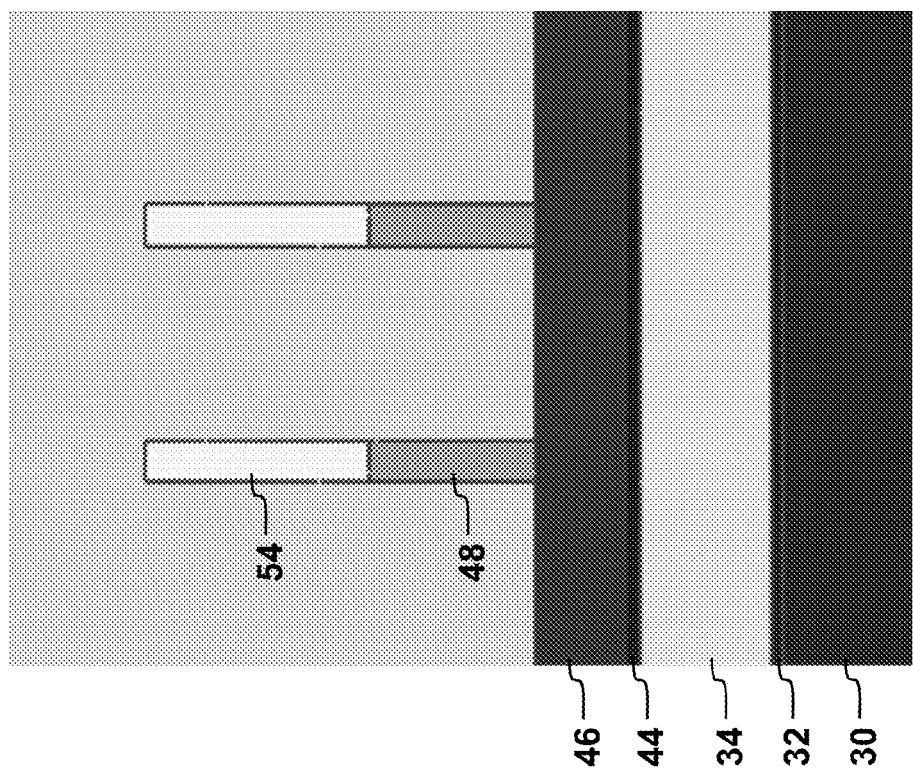

A layer of polysilicon 46 is deposited on the structure. A hard mask layer 48 is then deposited on poly 46, as shown in FIG. 2E. Hard mask 48 can be nitride, or a NON layer (with nitride, oxide, nitride sublayers). The resulting structure defines columns of STI isolations regions 50 (with oxide 42) separated by interleaved columns of active regions 52. The memory cells will be formed in columns in the active regions 52. Photo resist 54 is coated over the structure, and selectively removed by a photolithography process leaving stripes of photo resist 54 extending orthogonally to the column length of the active and isolation regions 50/52. A hard mask etch is then performed to remove the exposed portions of hard mask 48, as shown in FIG. 3A (in a view extending along one of the active regions 52).

Figure 3B:
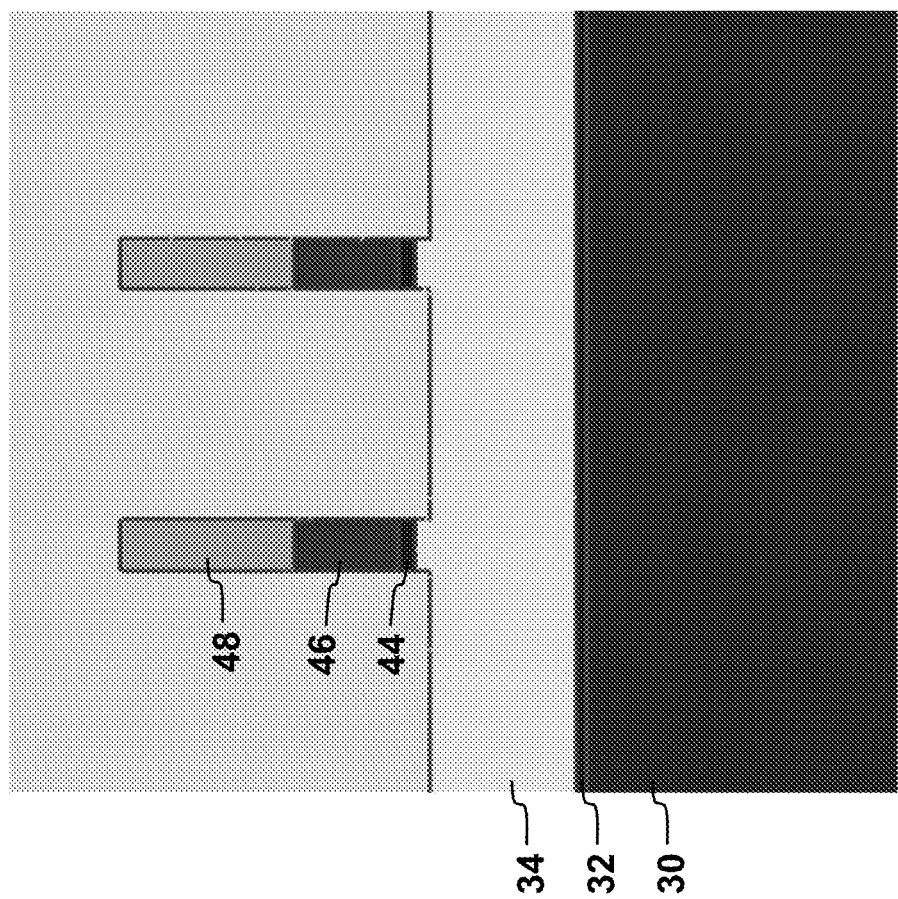

After photo resist 54 is removed, poly and oxide anisotropic etches are used to remove poly 46 and oxide 44 except those portions thereof underneath hard mask 48. A poly etch is then used recess the exposed top surface portions of poly 34, as shown in FIG. 3B. Oxide and nitride spacers are then formed along the exposed sidewalls of poly 34, oxide 44, poly 46 and hard mask 48. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface). Oxide spacers 56 and nitride spacers 58 are formed by oxide and nitride depositions and etches. The resulting structure is shown in FIG. 3C.

Figure 3E:
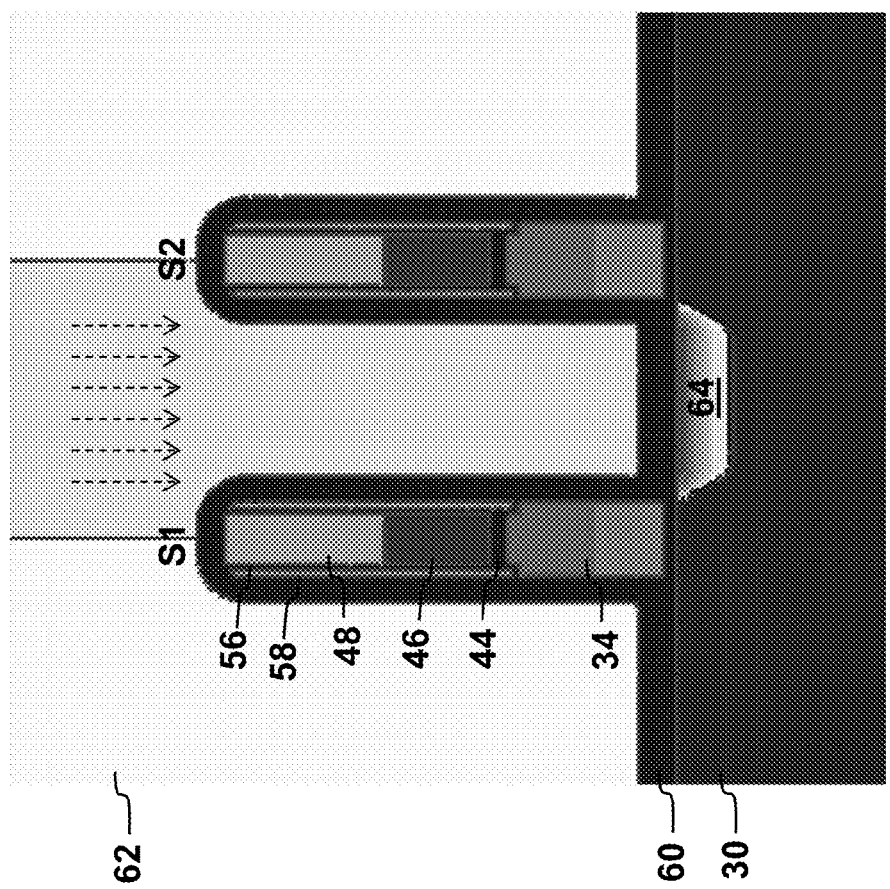
Figure 3F:
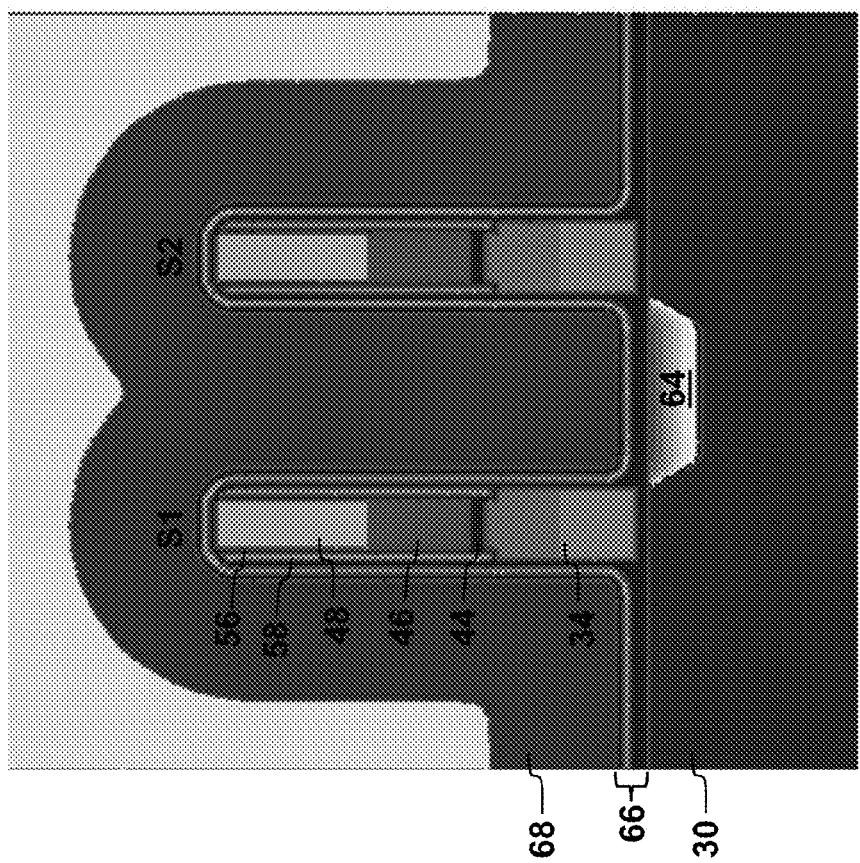
Figure 3G:
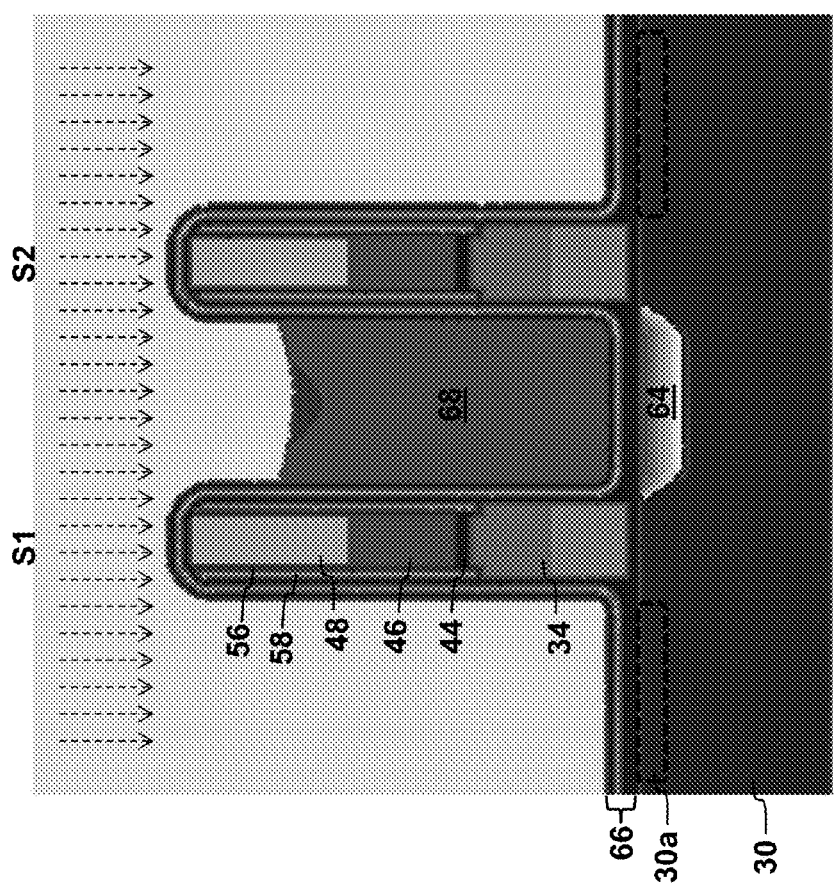

A poly etch is performed to remove the exposed portions of poly layer 34, leaving pairs of structure stacks S1 and S2 as shown in FIG. 3D. An oxide layer (screen) 60 is formed over the structure. Photo resist 62 is formed and selectively removed via photolithography leaving areas between adjacent stacks S1 and S2 exposed. An implant and anneal process is performed to form source region 64 (of a second conductivity type) in the substrate 30 between stacks S1 and S2, as shown in FIG. 3E. After the photo resist 62 is removed, an oxide etch is used to remove screen oxide 60 and any remaining portions of oxide layer 32. An insulation layer 66 (e.g. ONO—with oxide, nitride, oxide sublayers) is formed over the structure. A layer of polysilicon 68 is then deposited over the ONO layer 66, as shown FIG. 3F. A poly isotropic etch is then used to remove poly layer 68 except for in the space between stacks S1 and S2. A word line VT implant is then performed into the portions of substrate outside of the stacks S1 and S2 (i.e. those portions 30a of the substrate 30 that will be under the word line), as shown in FIG. 3G. A masking step (photo resist and etch using photolithography) can be used to protect areas of the substrate other than the memory cell area).

An oxide etch is performed to remove the top oxide layer from the ONO insulation 66 (which is now an ON insulation layer except for those portions protected by poly 68). A nitride deposition and etch is performed to form nitride spacers 70 along the sides of stacks S1 and S2, and remove the nitride from the ON insulation layer 66 over the substrate outside of stacks S1 and S2. Preferably at this stage, logic device processing on the same chip is performed, such as logic and high voltage well formation, implant anneal, HV and I/O oxide formation and core logic oxide formation. During this processing, the oxide on substrate 30 outside of stacks S1 and S2 is removed, and a word line oxide 72 is formed over the substrate. The resulting structure is shown in FIG. 3H.

Figure 3I:
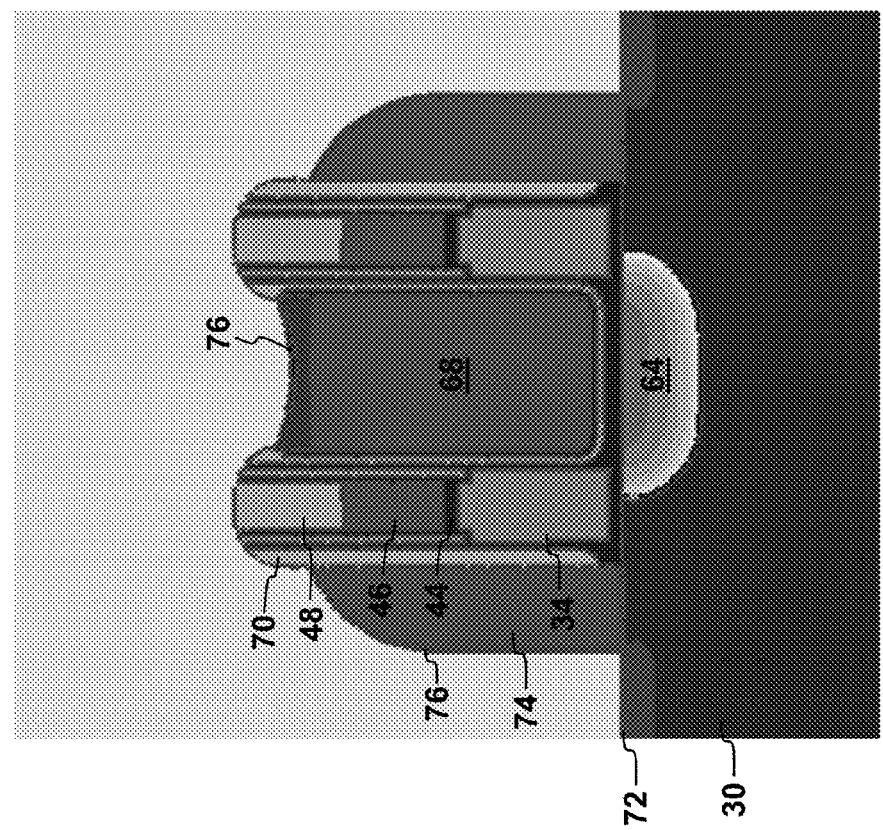
Figure 3J:
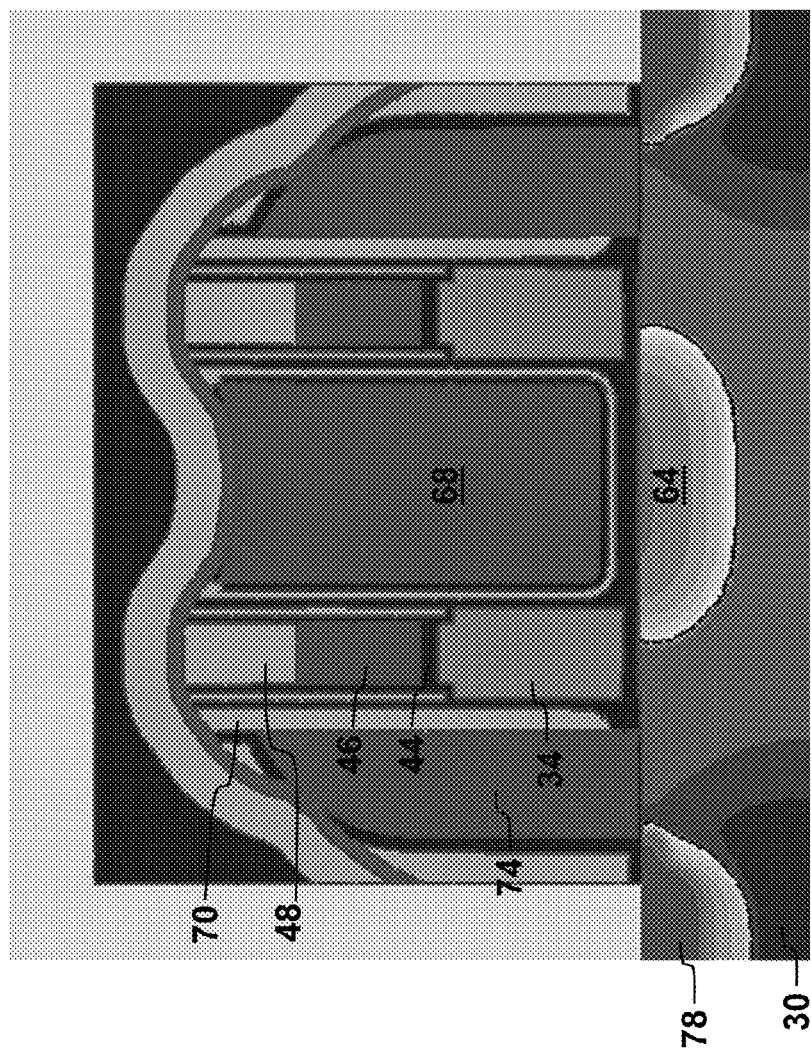

A layer of polysilicon is deposited over the structure. An implant and anneal for the deposited polysilicon (e.g. N+ implant such as phosphorus) can be performed. An anisotropic poly etch is then used to remove portions of the polysilicon layer, leaving poly spacers 74 abutting the nitride spacers 70 on the outsides of stacks S1 and S2. This poly etch can also be used to define remaining portions of the polysilicon layer in other portions of the chip, such as gates for low and high voltage logic devices. Photo resist and lithography can be used in conjunction with this polysilicon etch. The structure is then oxidized to form an oxide layer 76 on the exposed portions of poly spacers 74 and poly 68. The resulting structure is shown in FIG. 3I. Final memory array processing is then performed to complete the memory array structure, as shown in FIG. 3J. This processing includes an implant step to form drain regions 78 (of the second conductivity type) in the substrate adjacent poly spacers 74.

Figure 4B:
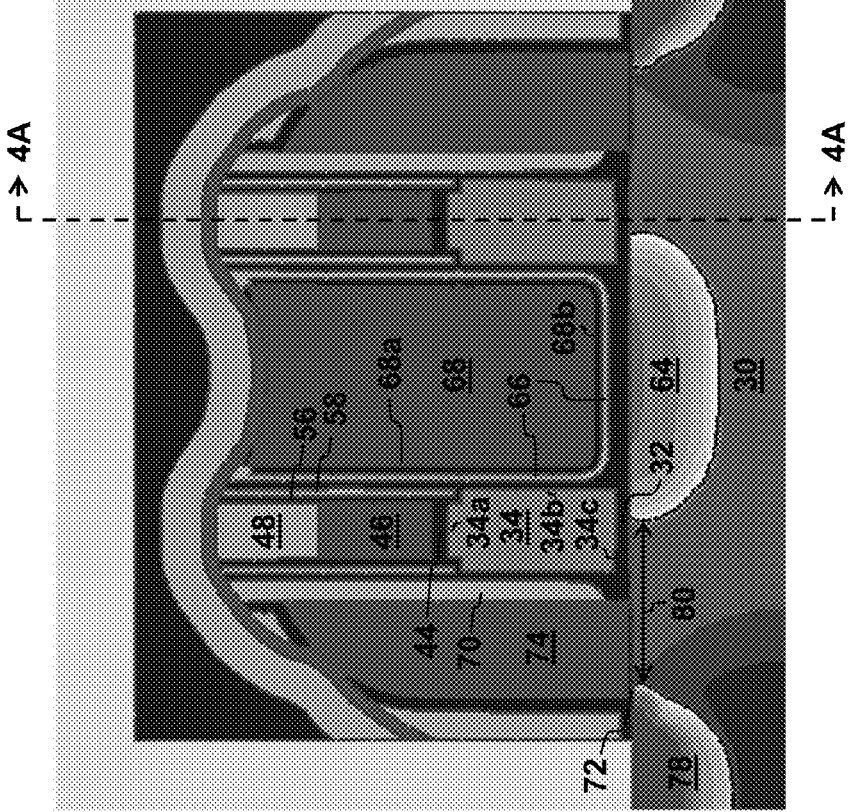
FIG. 4B is a side cross sectional view of the memory cells of the present invention (in the bit line direction).
Figure 4A:
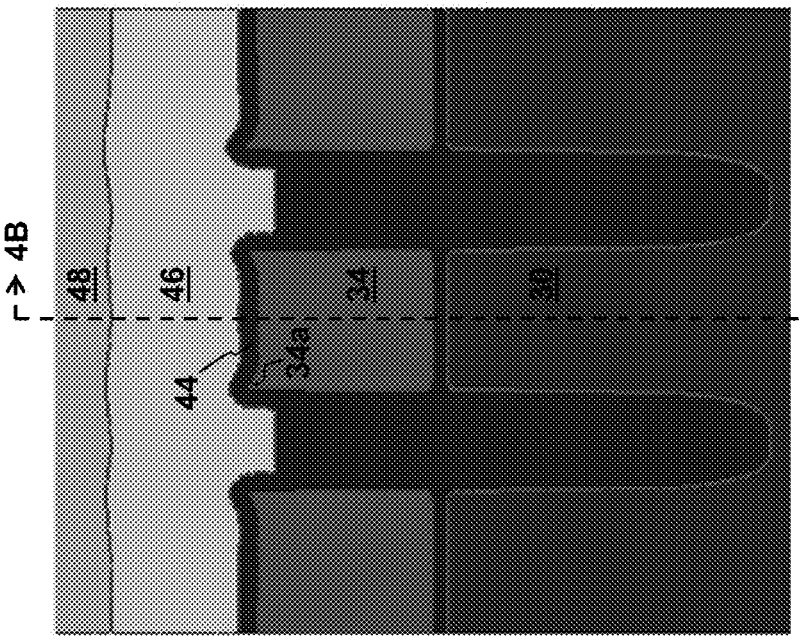
FIG. 4A is a side cross sectional view of the memory cells of the present invention (in the word line direction).

The final memory cell structure as viewed in the word line direction and in the bit line direction is shown in FIGS. 4A and 4B respectively. The memory cell includes source and drain regions 64, 78 respectively which define a channel region 80 of the substrate therebetween. Floating gate 34 is disposed over a first portion of the channel region 80 and over a portion of source region 64, insulated therefrom by oxide 32. Control gate 68 is disposed over the source region 64 (and is insulated therefrom by ONO layer 66), and is laterally adjacent to the floating gate 34 (and is insulated therefrom by ONO layer 66). Erase gate 46 is disposed vertically over floating gate 34, and insulated therefrom by oxide 44. The erase gate 46 is disposed laterally adjacent to an upper portion of the control gate 68 (and insulated therefrom by ONO layer 66, nitride spacer 58 and oxide spacer 56). The erase gates are formed as part of a conductive erase gate line that extends across the active regions and the isolation regions in a direction perpendicular to that in which the active and isolation regions extend. Each of the erase gate lines intercepts one of the erase gates in each of the active regions. The select gate 74 (also called the word line) is disposed over a second portion of the channel region 80 (and is insulated therefrom by oxide 72). A lower portion of the select gate 74 is disposed laterally adjacent to the floating gate 34 (and is insulated therefrom by nitride spacer 70 and by the oxide portion of ONO layer 66). An upper portion of the select gate 74 is disposed laterally adjacent to erase gate 46 (and is insulated therefrom by nitride spacer 70, the oxide portion of ONO layer 66, nitride spacer 58 and oxide spacer 56). Capacitive coupling between the floating and control gates is enhanced without utilizing excessive lateral footprint area because the floating gate 34 and control gate 68 are elongated in the vertical direction (e.g., floating gate 34 can have a vertically orientated side surface 34b greater in length than its bottom surface 34c, and control gate 68 can have a vertically orientated side surface 68a greater in length than its bottom surface 68b), with the vertically oriented side surfaces of these two gates adjacent to and insulated from each other.

To program the memory cell, a positive voltage is applied to select gate 74 to turn on the conductivity of the channel region portion below gate 74. A positive voltage is applied to the control gate 68, which, because of the strong capacitive coupling with the floating gate 34, appears on the floating gate. A positive voltage is applied to the source region 64 (relative to the drain region 78), so that electrons flow through the channel region from drain 78 to source 64. When the electrons approach that portion of channel region 80 under the floating gate, they become hot electrons due to the positive potential coupled to the floating gate, and inject themselves through oxide 32 and onto floating gate 34.

To erase the memory cell, a high positive voltage is applied to the erase gate 46, whereby electrons on the floating gate 34 are induced to tunnel from sharp edges 34a, through tunnel oxide 44, and onto erase gate 46.

To read the memory cell, a positive voltage is applied to select gate 74 to turn on the conductivity of the channel region portion below gate 74. A read potential voltage is applied across source 64 and drain 78, and a small positive voltage is applied to control gate 68 (which is coupled to floating gate 34). If the floating gate 34 is not programmed with electrons, the conductivity of the channel region below floating gate 34 will be turned on, and current will flow across the channel region (which is sensed as a non-programmed state). If the floating gate 34 is programmed with electrons, they will prevent the small coupled voltage from turning on the conductivity of the channel region below floating gate 34, and current flow across the channel region will be reduced or prohibited (which is sensed as a programmed state).

As stated above, enhanced capacitive coupling between the control gate 68 and the floating gate 34 is achieved by forming these two gates laterally adjacent each other, and extending the floating gate 34 vertically, which does not increase the floating gate lateral footprint while enhancing programming performance. Moreover, the erase gate 46 is formed vertically over the floating gate 34 in a self-aligned manner, whereby both sharp upper edges 34a of floating gate 34 face the erase gate 46 for enhanced tunneling through oxide 44 during the erase operation. This configuration allows the lateral footprint of the floating and erase gates to be scaled down while preserving memory cell erase performance. Because the erase gate extends entirely over sharp edges 34a and therefore the tunnel oxide 44 therebetween, the tunnel oxide 44 is protected from subsequent memory cell and logic device processing, such as LV oxide nitridation or HKMG (high-K metal gate) module processing. With the floating gate sharp edge running perpendicular to the length of the erase gate poly (which extends over a column of floating gates), the erase efficiency is enhanced without the need for a specially devised erase gate to floating gate over-hang. Finally, because the source line 64 is protected by the control gate poly 68, word line VT implant can be done with a less critical MCEL Mask, which opens the entire memory.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A non-volatile memory cell, comprising:
   a substrate of semiconductor material of a first conductivity type;
   first and second spaced-apart regions in the substrate of a second conductivity type different from the first conductivity type, with a channel region in the substrate therebetween;
   an electrically conductive floating gate having a first portion disposed vertically over and insulated from a first portion of the channel region, and a second portion disposed vertically over and insulated from the first region, wherein the floating gate includes a sloping upper surface that terminates with a pair of sharp edges at opposing sides of the sloping upper surface of the floating gate;
   an electrically conductive erase gate disposed vertically over and insulated from the floating gate, wherein the pair of sharp edges face and are insulated from the erase gate, wherein the erase gate has a bottom surface with a portion facing, and having a shape matching that of, the sloping upper surface of the floating gate, and wherein the bottom surface of the erase gate further includes a pair of portions, each portion of the pair of portions wraps around a respective sharp edge of the pair of sharp edges;
   an electrically conductive control gate having a first portion disposed laterally adjacent to and insulated from the floating gate, and vertically over and insulated from the first region; and an electrically conductive select gate having a first portion disposed vertically over and insulated from a second portion of the channel region, and laterally adjacent to and insulated from the floating gate.

2. The non-volatile memory cell of claim 1, wherein the control gate has a second portion disposed laterally adjacent to and insulated from the erase gate.

3. The non-volatile memory cell of claim 1, wherein the select gate has a second portion disposed laterally adjacent to and insulated from the erase gate.

4. The non-volatile memory cell of claim 1, wherein the select gate is a spacer.

5. The non-volatile memory cell of claim 1, wherein the floating gate includes:
   a bottom surface facing the first portion of the channel region and the first region; and
   a side surface facing the control gate;
   wherein the side surface has a vertical length that is greater than a horizontal length of the bottom surface.

6. An array of non-volatile memory cells, comprising:
   a substrate of semiconductor material of a first conductivity type;
   spaced apart isolation regions formed on the substrate which are substantially parallel to one another and extend in a first direction, with an active region between each pair of adjacent isolation regions;
   each of the active regions including pairs of memory cells, each of the memory cell pairs including:
   a first region and a pair of second regions spaced apart in the substrate having a second conductivity type different from the first conductivity type, with channel regions in the substrate between the first region and the second regions,
   a pair of electrically conductive floating gates each having a first portion disposed vertically over and insulated from a first portion of a respective one of the channel regions, and a second portion disposed vertically over and insulated from the first region, wherein each floating gate of the pair of floating gates includes a sloping upper surface that terminates with a pair of sharp edges at opposing sides of the sloping upper surface of the floating gate, a pair of electrically conductive erase gates, each erase gate of the pair of erase gates disposed vertically over and insulated from a respective floating gate of the pair of floating gates, wherein the pair of sharp edges of each floating gate of the pair of floating gates face a respective erase gate of the pair of erase gates, wherein each erase gate of the pair of erase gates has a bottom surface with a portion facing, and having a shape matching that of, the sloping upper surface of the respective floating gate, and wherein the bottom surface of each erase gate of the pair of erase gates further includes a pair of portions, each portion of the pair of portions wraps around a respective sharp edge of the pair of sharp edges of the respective floating gate, an electrically conductive control gate having a first portion disposed laterally adjacent to and insulated from the pair of floating gates, and vertically over and insulated from the first region, and a pair of electrically conductive select gates each having a first portion disposed vertically over and insulated from a second portion of a respective one of the channel regions, and laterally adjacent to and insulated from a respective floating gate of the pair of floating gates;

wherein each of the erase gates is formed as part of a conductive erase gate line that extends across the active regions and the isolation regions in a second direction perpendicular to the first direction, and wherein each of the erase gate lines intercepts one of the erase gates in each of the active regions.

7. The array of claim 6, wherein for each of the memory cell pairs, the control gate has a second portion disposed laterally between and insulated from the pair of erase gates.

8. The array of claim 6, wherein for each of the memory cell pairs each select gate of the pair of select gates has a second portion disposed laterally adjacent to and insulated from a respective erase gate of the pair of erase gates.

9. The array of claim 6, wherein each of the select gates is a spacer.

10. The array of claim 6, wherein for each of the memory cell pairs, each floating gate of the pair of floating gates includes:
 a bottom surface facing the first portion of the respective one of the channel regions and the first region; and
 a side surface facing the control gate;
 wherein the side surface has a vertical length that is greater than a horizontal length of the bottom surface.

11. A method of forming a nonvolatile memory cell, comprising:
 providing a substrate of semiconductor material of a first conductivity type;
 forming first and second spaced-apart regions in the substrate of a second conductivity type different from the first conductivity type, with a channel region in the substrate therebetween;
 forming an electrically conductive floating gate having a first portion disposed vertically over and insulated from a first portion of the channel region, and a second portion disposed vertically over and insulated from the first region, wherein the floating gate includes a sloping upper surface that terminates with a pair of sharp edges at opposing sides of the sloping upper surface of the floating gate;
 forming an electrically conductive erase gate disposed vertically over and insulated from the floating gate, wherein the pair of sharp edges face and are insulated from the erase gate, wherein the erase gate has a bottom surface with a portion facing, and having a shape matching that of, the sloping upper surface of the floating gate, and wherein the bottom surface of the erase gate further includes a pair of portions, each portion of the pair of portions wraps around a respective sharp edge of the pair of sharp edges;
 forming an electrically conductive control gate having a first portion disposed laterally adjacent to and insulated from the floating gate, and vertically over and insulated from the first region; and
 forming an electrically conductive select gate having a first portion disposed vertically over and insulated from a second portion of the channel region, and laterally adjacent to and insulated from the floating gate.

12. The method of claim 11, wherein the forming of the select gate includes forming a spacer of conductive material.

13. The method of claim 11, wherein the floating gate includes:
 a bottom surface facing the first portion of the channel region and the first region; and
 a side surface facing the control gate;
 wherein the side surface has a vertical length that is greater than a horizontal length of the bottom surface.

14. A method of forming an array of non-volatile memory cells, comprising:
 providing a substrate of semiconductor material of a first conductivity type;
 forming spaced apart isolation regions formed on the substrate which are substantially parallel to one another and extend in a first direction, with an active region between each pair of adjacent isolation regions;
 forming pairs of memory cells in each of the active regions, each of the pairs of memory cells is formed by:
 forming a first region and a pair of second regions spaced apart in the substrate having a second conductivity type different from the first conductivity type, with channel regions in the substrate between the first region and the second regions,
 forming a pair of electrically conductive floating gates each having a first portion disposed vertically over and insulated from a first portion of a respective one of the channel regions, and a second portion disposed vertically over and insulated from the first region, wherein each floating gate of the of floating gates includes a sloping upper surface that terminates with a pair of sharp edges at opposing sides of the sloping upper surface of the floating gate,
 forming a pair of electrically conductive erase gates, each erase gate of the pair of erase gates disposed vertically over and insulated from a respective floating gate of the pair of floating gates, wherein the pair of sharp edges of each floating gate of the pair of floating gates face a respective erase gate of the pair of erase gates, wherein each erase gate of the pair of the erase gates has a bottom surface with a portion facing, and having a shape matching that of, the sloping upper surface of the respective floating gate, and wherein the bottom surface of each erase gate of the pair of erase gates further includes a pair of portions, each portion of the pair of portions wraps around a respective sharp edge of the pair of sharp edges of the respective floating gate,
 forming an electrically conductive control gate having a first portion disposed laterally adjacent to and insulated from the pair of floating gates, and vertically over and insulated from the first region, and forming a pair of electrically conductive select gates each having a first portion disposed vertically over and insulated from a second portion of a respective one of the channel regions, and laterally adjacent to and insulated from a respective floating gate of the pair of floating gates;

wherein each of the erase gates is formed as part of a conductive erase gate line that extends across the active regions and the isolation regions in a second direction perpendicular to the first direction, and wherein each of the erase gate lines intercepts one of the erase gates in each of the active regions.

15. The method of claim 14, wherein the forming of each of the select gates includes forming a spacer of conductive material.

16. The method of claim 14, wherein for each of the pairs of memory cell, each floating gate of the pair of floating gates includes:

a bottom surface facing the first portion of the respective one of the channel regions and the first region; and a side surface facing the control gate, wherein the side surface has a vertical length that is greater than a horizontal length of the bottom surface.

\* \* \* \* \*